(12) United States Patent
Fan et al.

(10) Patent No.: US 6,171,883 B1
(45) Date of Patent: Jan. 9, 2001

(54) IMAGE ARRAY OPTOELECTRONIC MICROELECTRONIC FABRICATION WITH ENHANCED OPTICAL STABILITY AND METHOD FOR FABRICATION THEREOF

(75) Inventors: Yang-Tung Fan, Hsin-Chu; Yu-Kung Hsiao, Tao-Yuan County; Chih-Hsiung Lee, Hsin-Chu, all of (TW)

(73) Assignee: Taiwan Semiconductor Manufacturing Company, Hsin-Chu (TW)

( * ) Notice: Under 35 U.S.C. 154(b), the term of this patent shall be extended for 0 days.

(21) Appl. No.: 09/252,467

(22) Filed: Feb. 18, 1999

(51) Int. Cl.[7] .................................................. H01L 21/00
(52) U.S. Cl. ............................................... 438/65; 257/233
(58) Field of Search .................................. 438/65, 69, 70; 257/233, 234, 432, 433

(56) References Cited

U.S. PATENT DOCUMENTS

| | | | |
|---|---|---|---|
| 5,654,202 | 8/1997 | Daly et al. | 438/70 |
| 5,670,384 | 9/1997 | Needham | 437/3 |
| 5,672,519 | 9/1997 | Song et al. | 437/3 |
| 5,895,943 | * 4/1999 | Park et al. | 257/232 |

* cited by examiner

Primary Examiner—David Nelms
Assistant Examiner—Quoc Hoang
(74) Attorney, Agent, or Firm—George O. Saile; Stephen B. Ackerman; Alek P. Szecsy

(57) ABSTRACT

A method for forming an image array optoelectronic microelectronic fabrication, and the image array optoelectronic microelectronic fabrication formed employing the method. There is first provided a substrate having a photoactive region formed therein. There is then formed over the substrate a patterned microlens layer which functions to focus electromagnetic radiation with respect to the photoactive region of the substrate. The patterned microlens layer is formed of a first material having a first index of refraction. Finally, there is then formed conformally upon the patterned microlens layer an encapsulant layer, where the encapsulant layer is formed of a second material having a second index of refraction no greater than, and preferably less than, the first index of refraction of the first material. The method of the present invention contemplates an image array optoelectronic microelectronic fabrication formed employing the method of the present invention. The method is particularly useful for forming image array optoelectronic microelectronic fabrications with enhanced optical stability.

6 Claims, 3 Drawing Sheets

IMAGE ARRAY OPTOELECTRONIC MICROELECTRONIC FABRICATION WITH ENHANCED OPTICAL STABILITY AND METHOD FOR FABRICATION THEREOF

BACKGROUND OF THE INVENTION

1. Field of the Invention

The present invention relates generally to methods for fabricating image array optoelectronic microelectronic fabrications. More particularly, the present invention relates to methods for fabricating with enhanced optical stability image array optoelectronic microelectronic fabrications.

2. Description of the Related Art

Microelectronic fabrications are formed from microelectronic substrates over which are formed patterned microelectronic conductor layers which are separated by microelectronic dielectric layers. Within the general art of microelectronic fabrication, there exist microelectronic fabrications whose operation is based solely upon electrical signal storage and processing characteristics of microelectronic devices and microelectronic circuits formed upon a microelectronic substrate. Examples of such microelectronic fabrications typically include semiconductor integrated circuit microelectronic fabrications and ceramic substrate packaging microelectronic fabrications. Similarly, there also exists within the general art of microeletronic fabrication microelectronic fabrications whose operation is predicated upon a codependent transduction, storage and/or processing of optical and electrical signals while employing optoelectronic microelectronic devices formed upon a microelectronic substrate. Examples of such optoelectronic microelectronic fabrications typically include, but are not limited to: (1) solar cell optoelectronic microelectronic fabrications, as well as; (2) image array optoelectronic microelectronic fabrications, such as but not limited to: (a) sensor image array optoelectronic microelectronic fabrications (i.e. color filter sensor image arrays), as well as: (b) display image array optoelectronic microelectronic fabrications (i.e. flat panel display image arrays). Sensor image array optoelectronic microelectronic fabrications find common usage in advanced consumer products such as digital cameras, while display image array optoelectronic microelectronic fabrications are well recognized and commonly employed as visual interface elements within mobile computers.

While the level of complexity and integration of both purely electronic microelectronic fabrications and optoelectronic microelectronic fabrications continues to increase, fabrication of advanced optoelectronic microelectronic fabrications often provides unique fabrication challenges insofar as fabrication of advanced optoelectronic microelectronic fabrications requires attention to both the optical properties and the electrical properties of materials which are employed in forming such advanced optoelectronic microelectronic fabrications. For example, of the problems which are commonly encountered when fabricating image array optoelectronic microelectronic fabrications, problems in achieving optical stability are often encountered.

It is thus towards the goal of forming image array optoelectronic microelectronic fabrications with enhanced optical stability that the present invention is directed.

Various optoelectronic microelectronic fabrication methods and/or resulting optoelectronic microelectronic fabrications have been disclosed in the art of optoelectronic microelectronic fabrication for forming optoelectronic microelectronic fabrications with desirable properties.

For example, Daly et al., in U.S. Pat. No. 5,654,202, discloses a method for forming a color filter sensor image array optoelectronic microelectronic fabrication with , attenuated topograpic related defects within the color filter sensor image array optoelectronic microelectronic fabrication. To realize that object, there is employed when fabricating the color filter sensor image array optoelectronic microelectronic fabrication a patternable planarizing layer as a substrate layer for a color filter layer within the color filter sensor image array optoelectronic microelectronic fabrication.

In addition, Needhln, in U.S. Pat. No. 5,670,384, discloses a method for efficiently forming a sensor image array optoelectronic microelectronic fabrication which incorporates therein a microlens whose optical performance has a reduced dependence upon the integrity of an exposed surface of the microlens. Within the sensor image array optoelectronic microelectronic fabrication, a focusing of an incident electromagnetic radiation image is effected at a lower interface of the microlens with respect to an underlying transparent layer of reduced index of refraction with respect to the microlens, rather than at the exposed upper surface of the microlens.

Finally, Song et al., in U.S. Pat. No. 5,672,519, discloses a method for fabricating a diode sensor image array optoelectronic microelectronic fabrication with enhanced optical precision when fabricating the diode sensor image array optoelectronic microelectronic fabrication. The method employs when fabricating the diode sensor image array optoelectronic microelectronic fabrication a stripe microlens layer having a flat top section rather than a stripe microlens layer having a convex top section as is more conventionally employed within the art of diode sensor image array optoelectronic microelectronic fabrication.

Desirable in the art of optoelectronic microelectronic fabrication are additional methods and materials which may be employed for forming image array optoelectronic microelectronic fabrications with enhanced optical stability.

It is towards that goal that the present invention is directed.

SUMMARY OF THE INVENTION

A first object of the present invention is to provide a method for forming an image array optoelectronic microelectronics fabrication, and the imiage array optoelectronic microelectronic fabrication fabricated in accord with the method.

A second object of the present invention is to provide a method for forming an image array optoelectronic microelectronic fabrication in accord with the first object of the present invention, where the image array optoelectronic microelectronic fabrication is formed with enhanced optical stability.

A third object of the present invention is to provide a method for forming an image array optoelectronic microelectronic fabrication in ccord with the first object of the present invention and the second object of the present invention, which method is readily commercially implemented.

In accord with the objects of the present invention, there is provided by the present invention a method for forming an image array optoelectronic microelectronic fabrication, and an image array optoelectronic microelectronic fabrication fabricated in accord with the method. To practice the method of the present invention, there is first provided a substrate having a photoactive region formed therein. There is then formed over the substrate a patterned microlens layer which functions to focus electromagnetic radiation with respect to the photoactive region within the substrate. The patterned microlens layer is formed of a first material having a first index of refraction. Finally, there is then formed conformally upon the patterned microlens layer an encapsulant layer. The encapsulant layer is formed of a second material having a second index of refraction no greater than the first index of refraction.

Within the present invention, the encapsulant layer inhibits optical degradation of the patterned microlens layer.

The method for forming the image array optoelectronic microelectronic fabrication of the present invention contemplates the image array optoelectronic microelectronic fabrication fabricated in accord with the method.

There is provided by the present invention a method for forming an image array optoelectronic microelectronics fabrication, where the image array optoelectronic microelectronic fabrication is formed with enhanced optical stability. The present invention realizes the foregoing object by forming conformally upon a patterned microlens layer employed for focusing electromagnetic radiation with respect to a photoactive region within a substrate over which is formed the patterned microlens layer within the image array optoelectronic microelectronic fabrication an encapsulant layer, where the encapsulant layer is formed of a second material having a second index of refraction no greater than the first index of refraction of a first material employed for forming the patterned microlens layer.

The method of the present invention is readily commercially implemented. The present invention employs methods and materials as are generally known within, or at least readily adaptable to, the art of optoelectronic microelectronic fabrication, and more specifically to the art of image array optoelectronic microelectronic fabrication. Since it is at least in part a process control in conjunction with design considerations which provide at least in part the present invention, rather than the existence of methods and materials which provides the present invention, the method of the present invention is readily commercially implemented.

BRIEF DESCRIPTION OF THE DRAWINGS

The objects, features and advantages of the present invention are understood within the context of the Description of the Preferred Embodiment, as set forth below. The Description of the Preferred Embodiment is understood within the context of the accompanying drawings, which form a material part of this disclosure, wherein.

DESCRIPTION OF THE PREFERRED EMBODIMENT

Figure 1:
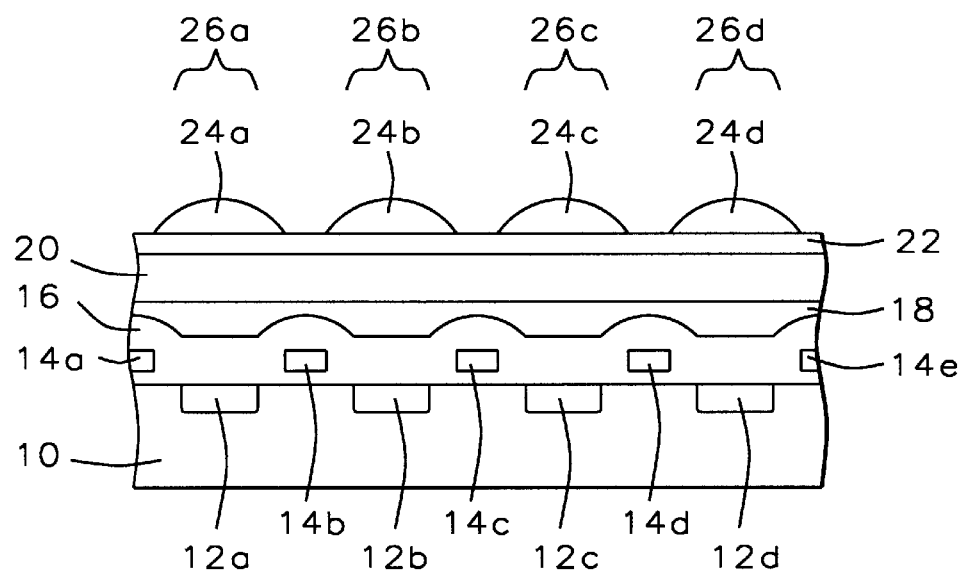
FIG. 1 and FIG. 2 show a pair of schematic cross-sectional diagrams illustrating the results of progressive stages in forming a color filter diode sensor image array optoelectronic microelectronic fabrication in accord with the present invention.

There is provided by the present invention a method for forming an image array optoelectronic microelectronic fabrication, where the image array optoelectronic microelectronic fabrication is formed with enhanced optical stability. The present invention realizes the foregoing object by forming conformally upon a patterned microlens layer employed for focusing electromagnetic radiation with respect to a photoactive region within a substrate over which is formed the patterned microlens layer within the image way optoelectronic microelectronic fabrication a conformal encapsalant layer, where the conformal eacapsulant layer is formed of a second material having a second index of refraction no greater than a first index of refraction of a first material employed for forming the patterned microlens layer.

Although the preferred embodiment of the present invention illustrates the present invention within the context of a color filter diode sensor image array optoelectronic microelectronic fabrication, the present invention may be employed for forming with enhanced optical stability image array optoelectronic microelectronic fabrications including but not limited to sensor image array optoelectronic microelectronic fabrications (which sense incident electromagnetic radiation while employing photosensor photoactive regions within a substrate) and display image array optoelectronic microelectronic fabrications (which display electromagnetic radiation which is emitted from photoemissive photoactive regions within a substrate). Similarly, such photosensitive and photoemissive photoactive regions may employ photoactive elements such as but not limited to photodiodes and photocapacitors. In addition, image array optoelectronic microelectronic fabrications whose optical properties may be stabilized employing the present invention need not be color filter image array optoelectronic microelectronic fabrications, but may also be gray scale image array optoelectronic microelectronic fabrications. Finally, again, while the preferred embodiment of the present invention illustrates the present invention within the context of a color filter diode sensor image array optoelectronic microelectronic fabrication, the present invention may similarly be employed to enhance optical stability of single optical elements within discrete non-array optoelectronic microelectronic fabrications which may include, but are not limited to, discrete sensor non-array optoelectronic microelectronic fabrications and discrete display non-array optoelectronic microelectronic fabrications.

In a most general sense, the present invention provides value in fabricating with enhanced optical stability an optoelectronic microelectronic fabrication which has formed therein a minimum of one microlens layer which focuses electromagnetic radiation with respect to a photoactive region within a substrate over which is formed the microlens layer. The microlens layer may be selected from the group including but not limited to substantially elongate strip patterned microlens layers and substantially circular patterned microlens layers.

Figure 2:
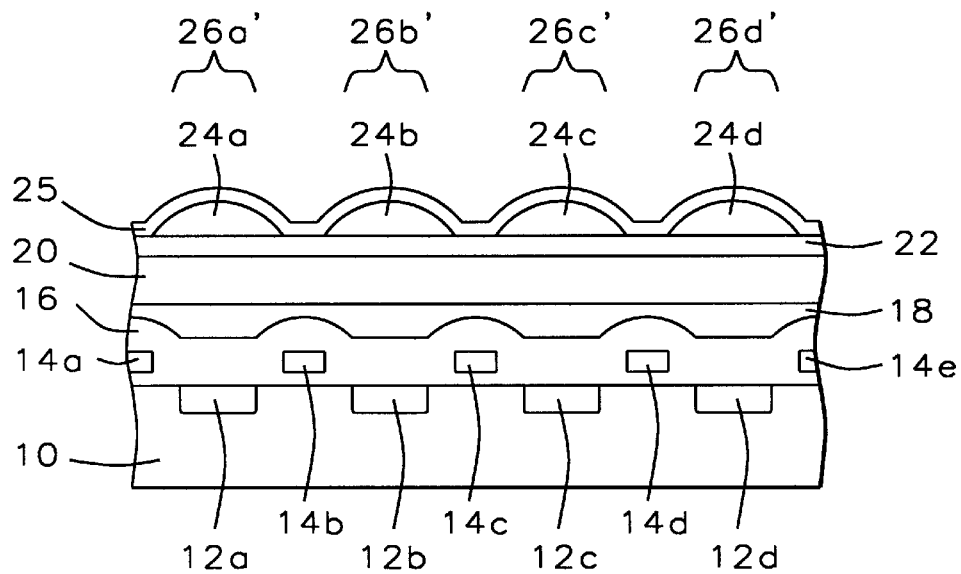

Referring now to FIG. 1 and FIG. 2, there is shown a pair of schematic cross-sectional diagrams illustrating the results of progressive stages in forming a color filter diode sensor image array optoelectronic microelectronic fabrication in accord with the present invention. Shown in FIG. 1 is a schematic cross-sectional diagram of the color filter diode sensor image array optoelectronic microelectronic fabrication at an earlier stage in its fabrication in accord with the present invention.

Shown within FIG. 1 is a substrate 10 having formed therein a series of photo active regions 12a, 12b, 12c and 12d. Within the preferred embodiment of the present invention, the substrate 10 is typically and preferably a silicon semiconductor substrate, and the photo active regions 12a, 12b, 12c and 12d are typically and preferably photodiode regions of the silicon semiconductor substrate, although, as suggested above, the present invention may provide value with respect to an optoelectronic microelectronic fabrication which employs a substrate other than a silicon semiconductor substrate, which substrate has formed therein, thereupon or thereover photoactive regions formed of other than photodiodes. Typically and preferably, the silicon semiconductor substrate will have an N– or P– doping concentration, while the photodiode photoactive regions 12a, 12b, 12c and 12d will typically and preferably have a complentary P+ or N+ doping concentration.

Although FIG. 1 illustrates the substrate 10 as a flat substrate having the photoactive regions 12a, 12b, 12c and 12d formed contiguously therein, it is understood by a person skilled in the art that the photoactive regions 12a, 12b, 12c and 12d may also be formed topographically within the substrate 10, and the substrate 10 may also have formed therein additional appropriate layers and structures, such as but not limited to channel stop layers and structures, as are needed to adequately isolate the photoactive regions 12a, 12b, 12c and 12d.

Shown also within FIG. 1 formed upon the substrate 10 including the photoactive regions 12a, 12b, 12c and 12d of the substrate 10 is a blanket passivation layer 16 which has formed therein at locations alternating with the series of photoactive regions 12a, 12b, 12c and 12d a series of vertical patterned conductor layers 14a, 14b, 14c, 14d and 14e. The series of vertical patterned conductor layers 14a, 14b, 14c, 14d and 14e typically serves as a first directional charge collection array within the color filter diode sensor image array optoelectronic microelectronics fabrication whose schematic cross-sectional diagram is illustrated in FIG. 1, while the blanket passivation layer 16 serves to separate the vertical patterned conductor layers 14a, 14b, 14c, 14d and 14e from the substrate 10.

Within the preferred embodiment of the present invention, the blanket passivation layer 16 is typically and preferably formed of a passivation material which is transparent to incident electromagnetic radiation whose detection and classification the color filter diode sensor image array optoelectronic microelectronic fabrication whose schematic cross-sectional diagram is illustrated in FIG. 1 is designed to detect and classify. Typically and preferably, the blanket passivation layer 16 is formed of a passivation material selected from the group including but not limited to silicon oxide passivation materials, silicon nitride passivation materials, silicon oxynitride passivation materials and composites thereof Similarly, within the preferred embodiment of the present invention, the vertical patterned conductor layers 14a, 14b, 14c, 14d and 14e are each formed of a conductor material as is similarly conventional in the art of optoelectronic microelectronic fabrication, such conductor materials being selected from the group including but not limited to metal, metal alloy, doped polysilicon and polycide (doped polysilicon/metal silicide stack) conductor materials.

Shown also within FIG. 1 formed upon the blanket passivation layer 16 is a blanket planarizing layer 18, and there is similarly also shown within FIG. 1 formed upon the blanket planarizing layer 18 a blanket color filter layer 20. Within the preferred embodiment of the present invention, the blanket planarizing 18 layer and the blanket color filter layer 20 may be formed employing methods and materials as are conventional in the art of optoelectronic microelectronic fabrication. Typically and preferably, the blanket planarizing layer 18 is formed of a planarizing material which, similarly with the blanket passivation layer 16, is transparent to a spectrum of electromagnetic radiation whose detection and classification is effected while employing the color filter diode sensor image array optoelectronic microelectronic fabrication whose schematic cross-sectional diagram is illustrated in FIG. 1. Such planarizing materials may include, but are not limited to spin-on-glass (SOG) planarizing materials and spin-on-polymer (SOP) planarizing materials, such as but not limited to photoresist spin-on-polymer (SOP) planarizing materials.

Similarly, within the preferred embodiment of the present invention with respect to the blanket color filter layer 20, the blanket dolor filter layer 20 is typically and preformed employing methods and material analogous or equivalent to the methods and materials as disclosed within the references cited within the Description of the Related Art, in particular Song et al., the teachings of which references are incorporated herein fully by reference. Although not specifically illustrated within the schematic cross-sectional diagram of FIG. 1, the blanket color filter layer 20 typically and preferably has several patterned color layers incorporated therein, as is conventional in the art of color filter diode sensor image array optoelectronic microelectronic fabrication. Typically and preferably, the blanket color filter layer 20 is formed to a thickness of from about 10000 to about 20000 of angstroms while employing an organic polymer binder material having incorporated therein separate sections of color filter materials which encompass either the three primary colors of red, blue and green or the three complementary primary colors of cyan, magenta and yellow.

Finally, there is shown in FIG. 1 formed upon the blanket color filter layer 20 a blanket spacer layer 22 in turn having formed spaced thereupon a series of patterned microlens layers 24a, 24b, 24c and 24d. Within the preferred embodiment of the present invention, the blanket spacer layer 22 is preferably formed of a material which is intended to separate the series of patterned microlens 24a, 24b, 24c and 24d from the blanket color filter layer 20. Similarly with the blanket passivation layer 16 and the blanket planarizing layer 18, the blanket spacer layer 22 is preferably formed of a spacer material which is transparent to a spectrum of incident electromagnetic radiation whose detection and classification is effected by the color filter diode sensor image array optoelectronic microelectronic fabrication whose schematic cross-sectional diagram is illustrated in FIG. 1. Also similarly with the blanket passivation layer 16, the blanket spacer layer 22 is also preferably formed from a spacer material selected from the group including but not limited to silicon oxide materials, silicon nitride materials, silicon oxynitride materials, as well as photoresist spin-on-polymer (SOP) materials, and composites thereof. Typically and preferably, the blanket spacer layer 22 is formed to a thickness of from about 20000 to about 30000 angstroms upon the blanket color filter layer 20.

Finally, with respect to the series of patterned microlens layers 24a, 24b, 24c and 24d, the series of patterned microlens layers 24a, 24b, and 24d is formed of a patterned photoresist material of appropriate optical properties, which patterned photoresist layer is thermally reflowed to form the series of patterned microlens layers 24a, 24b, 24c and 24d of convex shape, as illustrated within the schematic cross-sectional diagram of the color filter diode sensor image array optoelectronic microelectronic fabrication whose schematic cross-sectional diagram is illustrated in FIG. 1. For the preferred embodiment of the present invention, the series of patterned photoresist layers from which is formed the series of patterned microlens layers 24a, 24b, 24c and 24d is preferably formed of a positive photoresist material, for example and without limitation an MFR-344H positive photoresist material available from JSR, Japan, although negative photoresist materials and non-photoresist materials may also be employed, presuming appropriate optical properties and thermal reflow characteritics. Typically and preferably, the patterned positive photoresist layers from which are formed the patterned microlens layers 24a, 24b, 24c and 24d are formed as cylindrical patterned positive photoresist layers of diameter from about 5 to about 12 microns and thickness from about 15000 to about 30000 angstroms. The cylindrical patterned positive photoresist layers are then thermally reflowed at a temperature of from about 144 to about 176 degrees centigrade for a time period of from about 8 to about 12 minutes to form therefrom the series of patterned microlens layers 24a, 24b, 24c and 24d.

Although not specifically illustrated within the schematic cross-sectional diagram of FIG. 1, each of the patterned microlens layers 24a, 24b, 24c or 24d focuses incident electromagnetic radiation upon a corresponding one of the photoactive regions 12a, 12b, 12c or 12d. In so doing, it is typically desirable to control both the thicknesses and indicies of refraction of each of the blanket passivation layer 16, the blanket planarizing layer 18, the blanket color filter layer 20, the blanket spacer layer 22 and the patterned microlens layers 24a, 24b, 24c and 24d so that incident electromagnetic radiation is optimally focused upon each of the photoactive regions 12a, 12b, 12c or 12d. Thus, most optimally within the preferred embodiment of the present invention: (1) the blanket passivation layer 16 is formed of a silicon nitride material of index of refraction of about 1.4 to about 1.6 and thickness about 16000 to about 22000 angstroms upon the substrate 10; (2) the blanket planarizing layer 18 is formed of a negative photoresist material of index of refraction about 1.4 to about 1.6 and thickness about 20000 to about 30000 angstroms upon the blanket passivation layer 16; (3) the blanket color filter layer 20 is formed of an organic polymer binder material of thickness about 10000 to about 20000 angstroms upon the blanket planarizing layer 18; (4) the blanket spacer layer 22 is formed of a negative photoresist material of index of refraction about 1.4 to about 1.6 and thickness about 20000 to about 30000 angstroms formed upon the blanket color filter layer 20; and (5) the patterned microlens layers 24a, 24b, 24c and 24d, in addition to the above parameters, are formed with an index of refraction of from about 1.5 to about 1.7 upon the blanket spacer layer 22.

As is illustrated within the schematic cross-sectional diagram of FIG. 1, each portion of the color filter diode sensor image array optoelectronic microelectronic fabrication whose schematic cross-sectional diagram is illustrated in FIG. 1 which includes a patterned microlens layer 24a, 24b, 24c or 24d, in conjunction with a corresponding photoactive region 12a, 12b, 12c or 12d of the substrate 10 comprises a pixel element 26a, 26b, 26c or 26d.

Referring now to FIG. 2, there is shown a schematic cross-sectional diagram of a color filter diode sensor image array optoelectronic microelectronic fabrication illustrating the results of further processing of the color filter diode sensor image array optoelectronic microelectronic fabrication whose schematic cross-sectional diagram is illustrated in FIG. 1. Shown in FIG. 2 is a cross-sectional diagram of a color filter diode sensor image array optoelectronic microelectronic fabrication otherwise equivalent to the color filter diode sensor image array optoelectronic microelectronic fabrication whose schematic cross-sectional diagram is illustrated in FIG. 1, but wherein there is formed upon the color filter diode sensor image array optoelectronic microelectronic fabrication, including the exposed surfaces of the patterned microlens layers 24a, 24b, 24c and 24d and the blanket spacer layer 22, a blanket conformal encapsulant layer 25 which thus forms from the series of pixel elements 26a, 26b, 26c and 26d a corresponding series of encapsulated pixel elements 26a', 26b', 26c' and 26d'.

Within the preferred embodiment of the present invention, the blanket conformal encapsulant layer 25 is formed of a material which: (1) is formed conformally (i.e. it has a uniform thickness across the exposed surfing of the patterned microlens layers 24a, 24b, 24c and 24d and the blanket spacer layer 22 upon which it formed; and (2) has an index of refraction no greater than the index of refraction of the material from which is formed the patterned microlens layers 24a, 24b, 24c and 24d; while (3) protecting the patterned microlens layers 24a, 24b, 24c and 24d from optical degradation of the patterned microlens layers 24a, 24b, 24c and 24d. Such optical degradation of the patterned microlens layers 24a, 24b, 24c and 24d may include, but is not limited to thermally induced degradation, ambient environmentally induced degradation and mechanical degradation, although such degradation more commonly is thermally induced degradation which may be observed as a yellowing of the patterned microlens layers 24a, 24b, 24c and 24d presumably incident to thermal oxidation of the material from which is formed the patterned microlens layers 24a, 24b, 24c and 24d. Such yellowing typically compromises a spectral response of the color filter diode sensor image array optoelectronic microelectronic fabrication whose schematic cross-sectional diagram is illustrated in FIG. 1 or FIG. 2.

Within the present invention, there may be employed for forming the blanket conformal encapsulant layer 25 any conformal encapsulant material which fulfills the foregoing characteristics, including but not limited to encapsulant materials selected from the general groups of encapsulant materials including but not limited to inorganic encapsulant materials, organic encapsulant materials and composite encapsulant materials which may be formed employing methods including but not limited to chemical vapor deposition (CVD) methods, plasma enhanced chemical vapor deposition (PECVD) methods, physical vapor deposition (PVD) methods and spin coating methods. For the preferred embodiment of the present invention, the blanket conformal encapsulant layer 25 is preferably formed of a product number CT encapsulant material available from JSR, Japan, preferably formed to a conformal thickness as thin as is practicable while still providing desirable functionality conformally encapsulating exposed surfaces of the series of patterned microlens layers 24a, 24b and 24c and the blanket spacer layer 22. Such an encapsulant material may be conformally coated to provide the blanket conformal encapsulant layer 25 with an index of refraction of from about 1.1 to about 1.5, although lower values (i.e. from about 1.1 to about 1.4) of index of refraction of the encapsulant material are preferred and it is thus generally preferred that the index of refraction of the encapsulant material be less than, as opposed to no greater than, the index of refraction of the material from which is formed the series of patterned microlens layers 24a, 24b, 24c and 24d. Upon photochemical cure of such an encapsulant material, it is possible under certain circumstances to bleach any photoinitiator remaining within a series of patterned microlens layers 24a, 24b, 24c and 24d when such are formed of a positive photoresist material.

Figure 3:
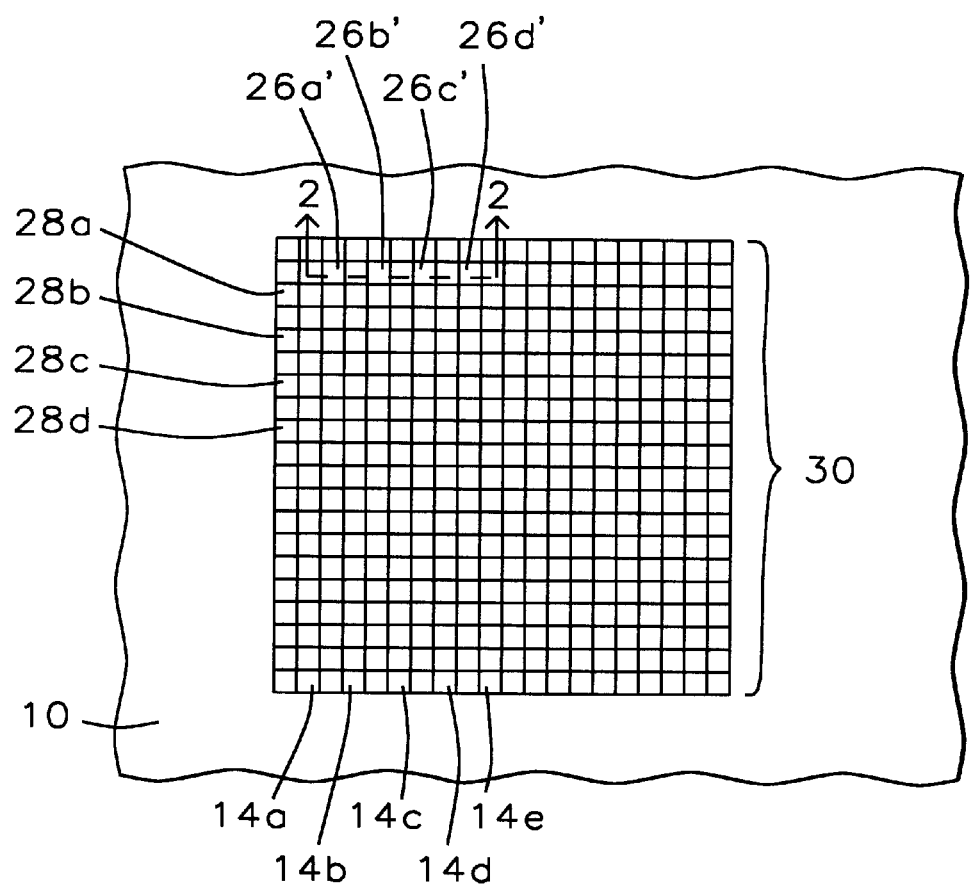
FIG. 3 shows a schematic plan-view diagram of a color filter diode sensor image array optoelectronic microelectronic fabrication incorporating therein the color filter diode sensor image array optoelectronic microelectronic fabrication whose schematic cross-sectional diagram is illustrated within FIG. 2.

Referring now to FIG. 3, there is shown a schematic plan-view diagram of a color filter diode sensor image array optoelectronic microelectronic fabrication which corresponds with, and has incorporated therein, the color filter diode sensor image array optoelectronic microelectronic fabrication whose schematic cross-sectional diagram is illustrated in FIG. 2.

Shown in FIG. 3 is the substrate 10 having formed thereover and incorporated therein a bidirectional array of encapsulated pixel elements 30 including the encapsulated pixel elements 26a', 26b', 26c', and 26d' as illustrated within FIG. 2, where the bidirectional array of encapsulated pixel elements 30 is separated in a vertical direction by a series of vertical patterned conductor layers including the vertical patterned conductor layers 14a, 14b, 14c, 14d and 14e as originally illustrated within the schematic cross-sectional diagram of FIG. 1. Similarly, there is also shown within FIG. 3 a series of horizontal patterned conductor layers 28a, 28b, 28c and 28d which is not otherwise illustrated within the schematic cross-sectional diagram of FIG. 1 or FIG. 2, but which may nonetheless be formed employing methods, materials and dimensions analogous or equivalent to the methods, materials and dimensions employed for forming the series of vertical patterned conductor layers including the vertical patterned conductor layers 14a, 14b, 14c, 14d and 14e.

Upon forming the color filter diode sensor image array optoelectronic microelectronic fabrication whose schematic cross-sectional diagram is illustrated within FIG. 2 or whose schematic plan view diagram is illustrated in FIG. 3, there is formed a color filter diode sensor image array optoelectronic microelectronic fabrication with enhanced optical stability. The color filter diode sensor image array optoelectronic microelectronic fabrication whose schematic cross-sectional diagram is illustrated in FIG. 2 or whose schematic plan view diagram is illustrated in FIG. 3 realizes that object by employing a blanket conformal encapsulant layer for encapsulating a series of patterned microlens layers within the color filter diode sensor image array optoelectronic microelectronic fabrication, such that the series of patterned microlens layers has an inhibited susceptibility to optical degradation and consequent compromise of optical properties of the series of patterned microlens layers. An encapsulant material from which is formed the blanket encapsulant layer has an index of refraction no greater than an index of refraction of a material from which is formed the patterned microlens layers.

EXAMPLES

In order to illustrate the value of the present invention in providing enhanced optical stability to an image array optoelectronic microelectronic fabrication, there was obtained two glass plates of dimensions about 6 inch width, about 6 inch length and about 0.76 millimeters thickness. Spin coated upon each of the two glass plates was a blanket layer of MFR-344H positive photoresist material available from JSR, Japan. Each of the two blanket photoresist layers was spin coated and thermally cured at a temperature of about 100 degrees centigrade for a time period of about 1 minute to provide each blanket photoresist layer of a thickness about 22500 angstroms and an index of refraction about 1.6. Neither blanket photoresist layer received any further patterning. To simulate a reflow after patterning which is typically employed for forming from patterned photoresist layers within image array optoelectronic microelectronic fabrications patterned microlens layers, each of the blanket photoresist layers was then thermally reflowed at a temperature of about 160 degrees centigrade for a time period of from about 600 seconds.

There was then formed upon one of the two thermally annealed blanket photoresist layers a blanket encapsulant layer formed of a product number CT organic polymer encapsulant material available from JSR, Japan. The blanket encapsulant layer was formed to a thickness of about 1000 angstroms, subsequently thermally annealed at a temperature of about 100 degrees centigrade for a time period of about 60 seconds to eliminate a carrier solvent, and finally photochemically cured employing mercury arc lamp radiation from a 2000 watt mercury lamp for a time period of 30 seconds.

There was then obtained an optical transmission spectrum for each of the two glass substrate composites having formed thereupon a reflowed blanket photoresist layer, with or without a blanket encapsulant layer.

Each of the glass composite substrates was then thermally annealed at a temperature of about 220 degrees centigrade for a time period of about 6 minutes and an equivalent optical transmission spectrum was again obtained for each of the two glass substrate composites having formed thereupon the blanket photoresist layers, with or without the blanket encapsulant layer.

Figure 4A:
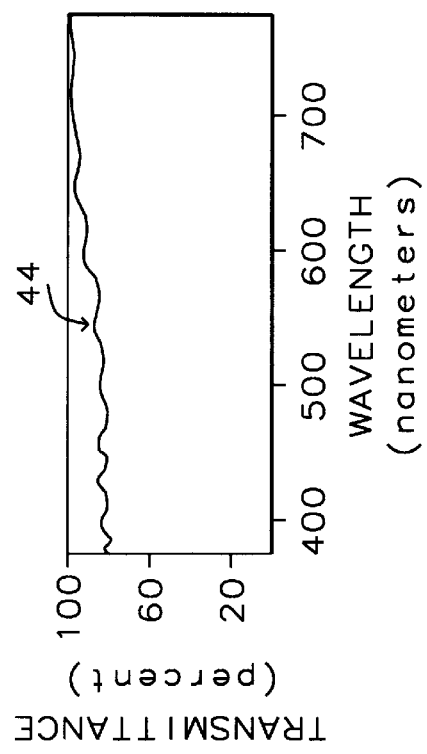
FIG. 4a and FIG. 4b show a pair of plots of Transmittance versus Wavelength for a layer of microlens material as is conventionally employed for forming patterned microlens layers within image array optoelectronic microelectronic fabrications, one each of the pair of plots being obtained before and after thermal annealing of the layer of microlens material under conditions as are typically employed within the art of image array optoelectronic microelectronic fabrication.
Figure 4B:
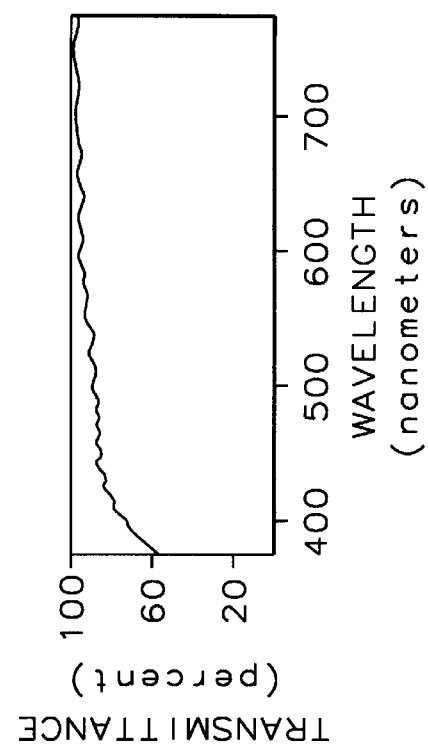
Figure 5A:
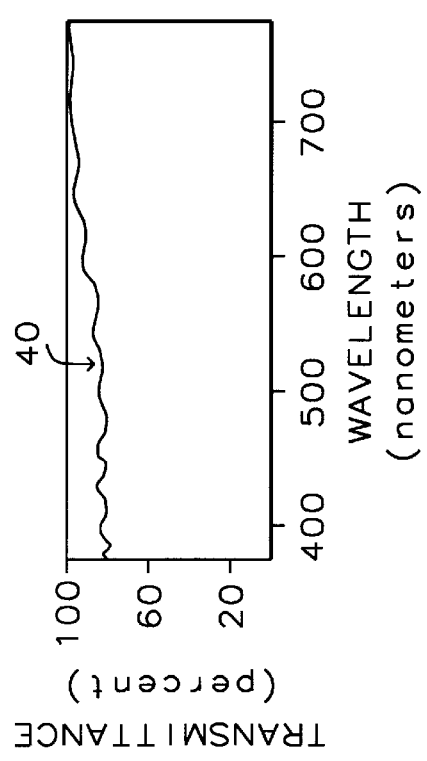
FIG. 5a and FIG. 5b show a pair of plots of Transmittance versus Wavelength for an encapsulated layer of microlens material in accord with the preferred embodiment of the present invention, one each of the pair of plots being obtained before and after thermal annealing of the encapsulated layer of microlens material under conditions as are typically employed within the art of image array optoelectronic microelectronic fabrication.

The series of four optical transmission spectra so obtained are illustrated within the plots of FIG. 4a, FIG. 4b, FIG. 5a and FIG. 5b. Within FIG. 4a, the curve corresponding with reference numeral 40 corresponds with the optical transmission spectrum of the glass substrate composite comprising the reflowed blanket photoresist layer alone, while within FIG. 5a the curve corresponding with reference numeral 44 corresponds with the optical transmission spectrum of the glass substrate composite comprising the reflowed blanket photoresist layer having formed thereupon the blanket encapsulant layer. The optical transmission spectra in FIG. 4a and FIG. 5a are obtained at the point prior to any additional further thermal annealing of the pertinent glass substrate composite fabrication.

Similarly, within the optical transmission spectrum of FIG. 4b the curve corresponding with reference numeral 42 results from the additional thermal annealing at the temperature of about 220 degrees centigrade for the time period of about 6 minutes of the glass substrate composite fabrication whose optical transmission spectrum is illustrated in FIG. 4a. Finally, within the optical transmission spectrum of FIG. 5b the curve corresponding with reference numeral 46 results from the additional thermal annealing at the temperature of about 220 degrees centigrade for the time period of about 6 minutes of the glass substrate composite fabrication whose optical transmission spectrum is illustrated in FIG. 5a.

Figure 5B:
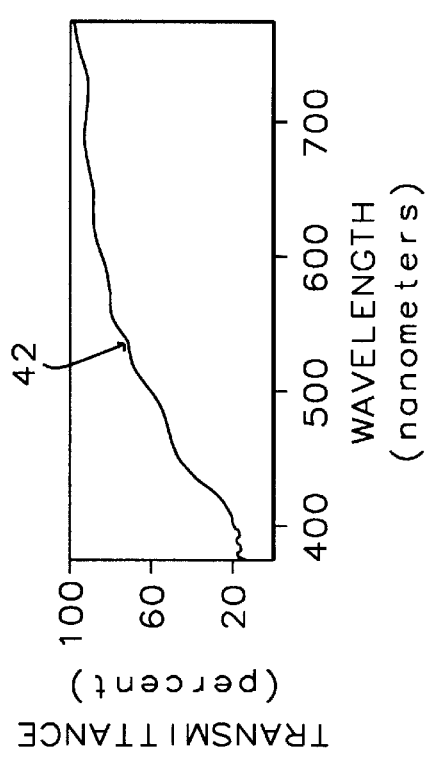

As is seen from review of the optical transmission spectra as illustrated within the plots of FIG. 4a, FIG. 4b, FIG. 5a and FIG. 5b, incident to employing the blanket encapsulant layer A when forming the optical composite fabrication whose optical transmission spectra is illustrated within FIG. 5a and FIG. 5b there is observed significantly greater optical stability below 500 nanometers upon thermally annealing the glass substrate composite at the temperature of about 220 degrees centigrade for the time period of about 6 minutes than there is observed for an equivalent thermal annealing of the optical composite fabrication whose optical spectra are illustrated within FIG. 4a and FIG. 4b. Such enhanced optical stability provides for image array optoelectronic microelectronic fabrications which may be employed at higher ambient temperatures, within more hostile ambient environments and/or with enhanced long term stability.

As is understood by a person skilled in the art, the preferred embodiment and examples of the present invention are illustrative of the present invention rather than limiting of the present invention. Revisions and modifications may be made to methods, materials, structures and dimensions which are employed to form a color filter diode sensor image array optoelectronic microelectronic fabrication in accord with the preferred embodiment and examples of the present invention while still forming an image array optoelectronic microelectronic fabrication in accord within the present invention, as defined by the appended claims.

What is claimed is:

1. A method for forming an optoelectronic microelectronic fabrication comprising:

providing a substrate having a photoactive region formed therein;

forming over the substrate a patterned microlens layer which functions to focus electromagnetic radiation with respect to the photoactive region within the substrate, the patterned microlens layer being formed of a first material having a first index of refraction; and forming conformally upon the patterned microlens layer an encapsulant layer, the encapsulant layer being formed of a second material having a second index of refraction no greater than the first index of refraction.

2. The method of claim 1 wherein the encapsulant layer inhibits optical degradation of the patterned microlens layer.

3. The method of claim 1 wherein the substrate is employed within an optoelectronic microelectronic fabrication selected from the group consisting of sensor image array optoelectronic microelectronic fabrications, sensor image non-array microelectronic fabrications, display image array optoelectronic microelectronic fabrications and display image non-array optoelectronic microelectronic fabrications.

4. The method of claim 1 wherein:

the substrate is a semiconductor substrate; and the photoactive region is a photodiode formed within the semiconductor substrate.

5. The method of claim 1 wherein:

the patterned microlens layer is formed of a reflowed photoresist material having the first index of refraction of from about 1.5 to about 1.7; and the encapsulant layer is formed of the second material having the second index of refraction of from about 1.1 to about 1.5.

6. The method of claim 5 wherein:

the photoresist material is a positive photoresist material; and the encapsulant layer is photochemically cured while employing a photoexposure which bleaches the positive photoresist material.

* * * * *